US012322721B2

(12) United States Patent
Deng et al.

(10) Patent No.: US 12,322,721 B2
(45) Date of Patent: *Jun. 3, 2025

(54) ASYMMETRIC STACKUP STRUCTURE FOR SoC PACKAGE SUBSTRATES

(71) Applicant: Apple Inc., Cupertino, CA (US)

(72) Inventors: Yikang Deng, San Jose, CA (US); Taegui Kim, San Jose, CA (US); Yifan Kao, Taoyuan (TW); Jun Chung Hsu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,167

(22) Filed: Nov. 17, 2023

(65) Prior Publication Data
US 2024/0162182 A1    May 16, 2024

Related U.S. Application Data

(63) Continuation of application No. 17/482,967, filed on Sep. 23, 2021, now Pat. No. 11,862,597.

(51) Int. Cl.
*H01L 23/498*    (2006.01)
*H01L 23/00*    (2006.01)
(Continued)

(52) U.S. Cl.
CPC ........ *H01L 24/24* (2013.01); *H01L 23/49827* (2013.01); *H01L 24/25* (2013.01); *H01L 24/82* (2013.01); *H01L 25/0657* (2013.01); *H01L 25/50* (2013.01); *H01L 23/13* (2013.01); *H01L 2224/2401* (2013.01); *H01L 2224/24011* (2013.01); *H01L 2224/24227* (2013.01); *H01L 2224/2518* (2013.01); *H01L 2224/82005* (2013.01); *H01L 2225/06524* (2013.01); *H01L 2225/06548* (2013.01); *H01L 2225/06572* (2013.01); *H01L 2924/15153* (2013.01); *H01L 2924/19011* (2013.01)

(58) Field of Classification Search
CPC ... H01L 24/24; H01L 23/49827; H01L 24/25; H01L 24/82; H01L 25/0657
See application file for complete search history.

(56) References Cited

U.S. PATENT DOCUMENTS 8,810,024 B2 * 8/2014 Lin ...................... H01L 21/568
438/666
9,793,219 B2    10/2017 Shimizu
(Continued)

*Primary Examiner* — Dale E Page
*Assistant Examiner* — Wilner Jean Baptiste
(74) *Attorney, Agent, or Firm* — Kowert, Hood, Munyon, Rankin & Goetzel, P.C.; Gareth M. Sampson; Dean M. Munyon

(57) ABSTRACT

An asymmetric stackup structure for an SoC package substrate is disclosed. The package substrate may include a substrate with one or more insulating material layers. A first recess may be formed in an upper surface of the substrate. The recess may be formed down to a conductive layer in the substrate. An integrated passive device may be positioned in the recess. A plurality of build-up layers may be formed on top of the substrate. At least one via path may be formed through the build-up layers and the substrate to connect contacts on the lower surface of the substrate to contacts on the upper surface of the build-up layers.

20 Claims, 10 Drawing Sheets

(51) Int. Cl.
    *H01L 25/00*     (2006.01)
    *H01L 25/065*    (2023.01)
    *H01L 23/13*     (2006.01)

(56)     References Cited

U.S. PATENT DOCUMENTS

| | | |
|---|---|---|
| 10,707,168 B2 | 7/2020 | Alur et al. |
| 11,862,597 B2 * | 1/2024 | Deng ..................... H01L 24/24 |
| 2010/0072588 A1 | 3/2010 | Yang |
| 2019/0304935 A1 | 10/2019 | Collins et al. |
| 2019/0311981 A1 | 10/2019 | Gowda et al. |

\* cited by examiner

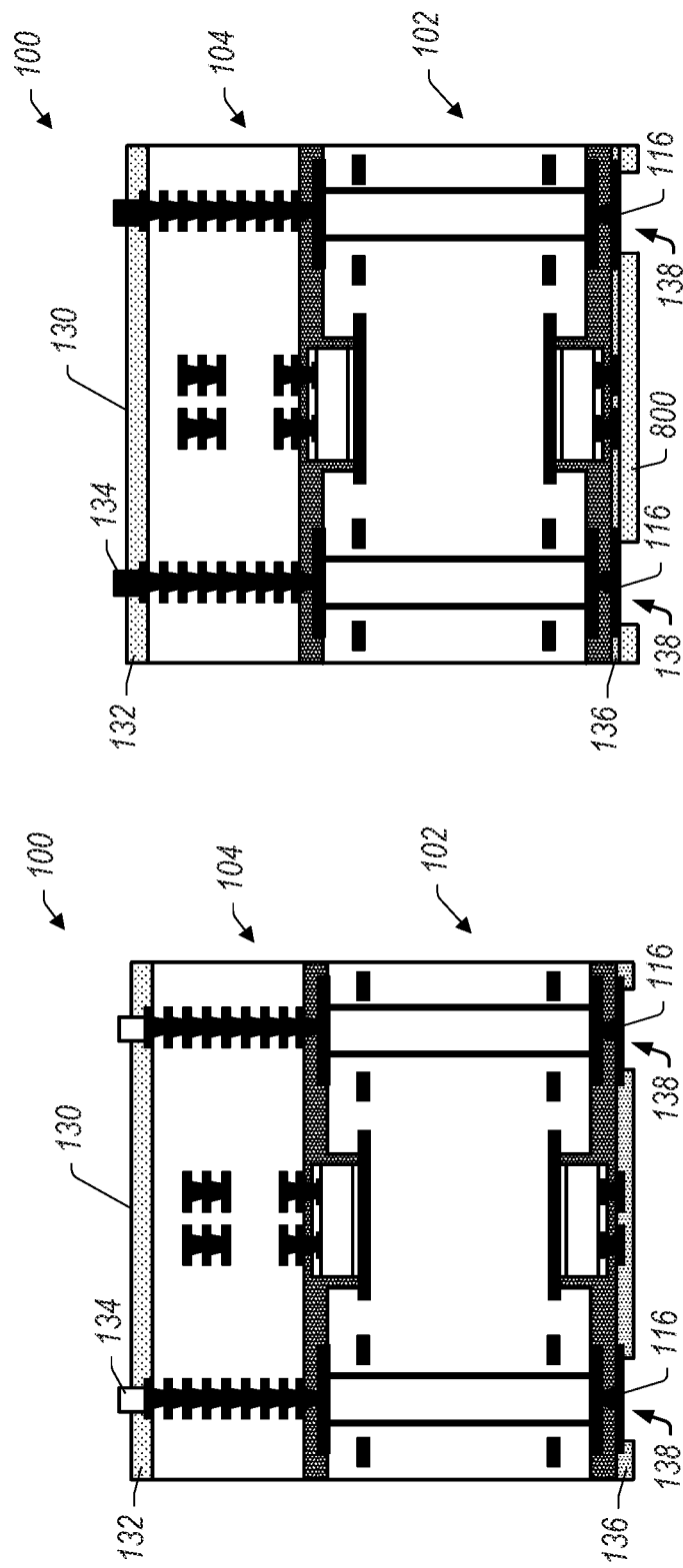

1200

A first recess is formed in an upper surface of a substrate core having multiple insulating layers built-up in a vertical dimension with at least one conductive material layer positioned in the insulating layers
1202

A second recess is formed in a lower surface of the substrate core in the vertical dimension
1204

A first integrated passive device is positioned in the first recess
1206

A second integrated passive device is positioned in the second recess
1208

A plurality of build-up layers is formed on the upper surface of the substrate core
1210

At least one via path is formed through the build-up layers and the substrate core where the at least one via path connects a second conductive contact positioned on the lower surface of the substrate core to an upper surface of the build-up layers
1212

*FIG. 12*

ASYMMETRIC STACKUP STRUCTURE FOR SoC PACKAGE SUBSTRATES

The present application is a continuation of U.S. application Ser. No. 17/482,967, entitled "Asymmetric Stackup Structure for SoC Package Substrates," filed Sep. 23, 2021, the disclosure of which is incorporated by reference herein in its entirety.

BACKGROUND

Technical Field

Embodiments described herein relate to integrated circuit package devices. More particularly, embodiments described herein relate to package substrates for system-on-chip (SoC) packages.

Description of the Related Art

Current system on a chip (SoC) devices are being pushed towards increased integration of functionality and optimization of power/performance. For example, a single SoC chip may include multiple instances of any of integrated circuits, integrated passive devices, memory devices, etc. With multiple devices placed on a single chip, there is increased need for improvements in the design and manufacturing of substrates for SoC packages.

SUMMARY

Various embodiments are disclosed for an asymmetric stackup structure for an SoC package substrate. In certain embodiments, a substrate core has a plurality of core layers built-up where the substrate core has a first recess in a top core layer and a second recess in a bottom core layer. The recessed may be formed down to conductive layers in the substrate core. A first integrated passive device may be positioned in the first recess and a second integrated passive device may be positioned in the second recess to provide to integrated passive devices in the package substrate. A plurality of build-up layers is positioned on the top core layer of the substrate core with at least one via path through the build-up layers and the substrate core. In various embodiments, the build-up layers are formed while the substrate core is coupled to a carrier substrate. An additional substrate core may be coupled to and mirrored to the substrate core to allow build-up layers to be formed and processed simultaneously on both substrate cores.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 7 depicts a side-view cross-sectional representation of an embodiment of surface finishes on a package substrate.

FIG. 8 depicts a side-view cross-sectional representation of an alternative embodiment of surface finishes on a package substrate.

FIG. 12 is a flow diagram illustrating a method of fabrication for a package substrate, according to some embodiments.

Figure 1:
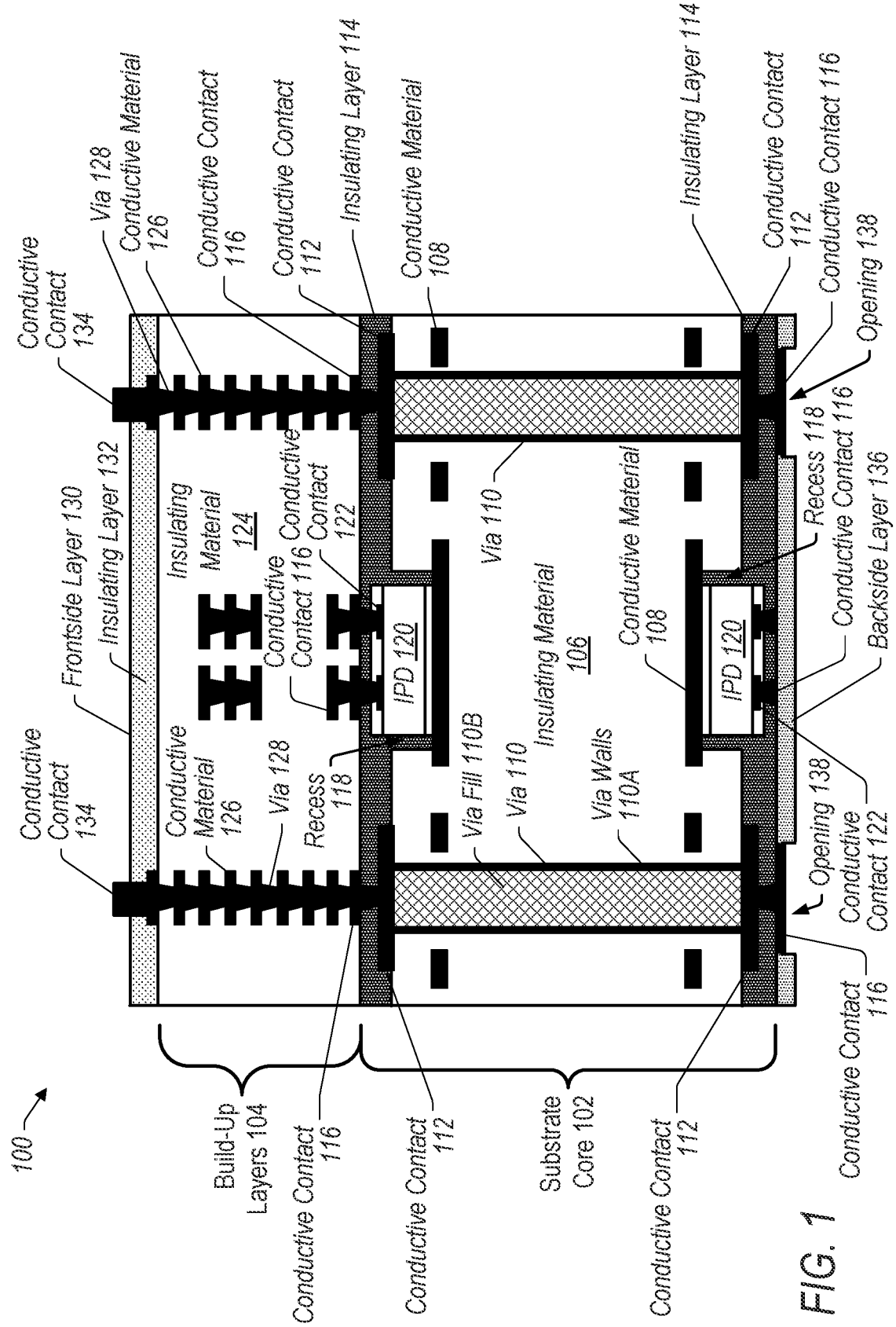
FIG. 1 depicts a side-view cross-sectional representation of an embodiment of a package substrate.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to a substrate for a system-on-chip (SoC) package that has an asymmetrical build-up from a core (or core layers) of the substrate and methods for making such a substrate. Many current SoC package substrates have symmetric build-up (or stackup) of layers in both directions from the core layers of the substrates. For instance, the substrates have the same number of layers on the frontside (e.g., layers above the core) and the backside (e.g., layers below the core) of the substrate. The symmetric build-up of layers is due to the requirements for the build-up process during substrate manufacturing. For instance, many current SoC package substrate manufacturing equipment requires layers to be built-up in both directions (symmetrically) from the core or core layers because of the design of the equipment.

In a symmetric stackup SoC package substrate, however, most of the routings for device connections are made in the frontside layers of the substrate with only a few simple routings being made in the backside layers. Thus, much of the backside layers contribute additional material cost without providing any technological benefit in the SoC package substrate (e.g., many layers have no technical impact on operation of the SoC). The present disclosure contemplates removing many of the backside layers of the SoC package substrate in an asymmetric stackup structure for the substrate. Embodiments contemplated herein may help increase output of SoC package substrates using existing manufacturing equipment, thus not requiring significant additional new capital investment. Additionally, the embodiments contemplated herein may reduce the cost of manufacturing SoC package substrates by reducing the number of layers in the substrates, thereby reducing material usage per package.

One embodiment disclosed herein has three broad elements: 1) a substrate core having a plurality of core layers built-up where the substrate core has a first recess in a top core layer and a second recess in a bottom core layer, 2) a first integrated passive device positioned in the first recess and a second integrated passive device positioned in the second recess, and 3) a plurality of build-up layers positioned on the top core layer of the substrate core with at least one via path through the build-up layers and the substrate core. In some embodiments, the at least one via path connects a conductive contact positioned on a lower surface of the substrate core to an upper surface of the build-up layers. For example, the via path may include a first via through the substrate core connected to a second via through the build-up layers. In certain embodiments, the via path includes a conductive contact on an upper surface of the substrate core that connects the first via to the second via.

In various embodiments, an upper surface of the first integrated passive device in is at substantially a same height as (e.g., flush with) an upper surface of the first conductive contact. Similarly, wherein a lower surface of the second integrated passive device may be at substantially a same height as a lower surface of the second conductive contact. In certain embodiments, the package substrate does not include build-up layers below the substrate core (e.g., the backside layers) that are symmetrical with the build-up layers above the substrate core (e.g., the frontside layers). Accordingly, the package substrate may be termed to be "asymmetric". While the package substrate may be asymmetric with respect to the build-up layers, any number of layers may be added below the substrate core as needed for a particular implementation of the package substrate, as described herein. For instance, the number of backside layers may be varied based on routing or power integrity needs of a package that includes the package substrate.

In short, the present inventors have recognized that an asymmetric package substrate can be generated to reduce the use of materials in the package. Additionally, the present inventors have recognized that an asymmetric package substrate can be made without significant changes to existing manufacturing equipment, thus reducing the need for new capital investment. The present inventors have also recognized that manufacturing methods for the asymmetric package substrates may be implemented that increase the production output of package substrates versus the production of symmetric package substrates. For instance, manufacturing methods may be implemented that produce two asymmetric package substrates in a process flow versus one symmetric package substrate.

FIG. 1 depicts a side-view cross-sectional representation of an embodiment of a package substrate. In the illustrated embodiment, package substrate 100 includes substrate core 102 and build-up layers 104. Substrate core 102 may include insulating material 106. Insulating material 106 may include, for example, resin material, fiber material, glass material, other electrically insulating materials, or combinations thereof. In various embodiments, insulating material 106 includes multiple layers of insulating material that are integrated to form substrate core 102. For instance, multiple layers of insulating material laminated or otherwise built-up or stacked in the vertical dimension of FIG. 1 to form insulating material 106. The number of layers in insulating material 106 may vary based on, for example, desired mechanical or electrical properties of substrate core 102. In the illustrated embodiment, insulating material 106 includes four insulating material layers (e.g., substrate core 102 is a 4-layer core).

In certain embodiments, substrate core 102 includes one or more conductive material layers 108. Conductive material layers 108 may include, for example, copper layers. The number and position of conductive material layers 108 in substrate core 102 may be varied based on design considerations for the mechanical or electrical properties of substrate core 102. In the illustrated embodiment, substrate core 102 includes two conductive material layers—an upper conductive material layer near the upper surface of the substrate core and a lower conductive material layer near the lower surface of the substrate core. Intermediate conductive material layers may be positioned in substrate core 102 to provide additional routing in the substrate core.

In various embodiments, one or more vias 110 are formed through insulating material 106 and conductive material 108 in substrate core 102. Vias 110 may include conductive material (such as copper) to provide conductive pathways through substrate core 102. In some embodiments, vias 110 are substantially vertical vias through substrate core 102. Other embodiments may, however, be contemplated where vias 110 include one or more non-vertical connections (e.g., zig-zagged vias). In the illustrated embodiment, vias 110 include via walls 110A and via fill 110B. Via walls 110A may include, for example, conductive material (such as copper) while via fill 110B includes insulating material (such as resin or fiber material). Thus, via walls 110A provide a conductive path through substrate core 102.

In certain embodiments, one or more conductive contacts 112 are positioned on the upper surface of substrate core 102 and the lower surface of substrate core 102. Conductive contacts 112 may be copper contacts or another suitable electrically conductive material. Conductive contacts 112 may be implemented to provide electrical connections to vias 110 on the upper and lower surfaces of substrate core 102. In various embodiments, substrate core 102 includes insulating layers 114 on the upper and lower surfaces of the substrate core. Insulating layers 114 may include, for example, ABF or other insulating materials. Insulating layers 114 may encapsulate or surround conductive contacts 112, as shown in FIG. 1. In some embodiments, conductive contacts 116 are positioned on the upper and lower surfaces of insulating layers 114. Conductive contacts 116 may connect through insulating layers 114 to conductive contacts 112 to provide electrical connections on the upper and lower surfaces of the insulating layers.

In the illustrated embodiment, substrate core 102 includes recesses 118 in the upper and lower surfaces of insulating material 106. In some embodiments, recesses 118 extend down to conductive material 108 in substrate core 102, as shown in FIG. 1. In other embodiments, recesses 118 may extend to other depths in substrate core 102 (such as other layers of conductive material in the substrate core).

In certain embodiments, integrated passive devices (IPDs) 120 are positioned in recesses 118. IPDs 120 may include, for example, pluralities of passive devices (such as capacitors or inductors) that are formed or integrated on a substrate (such as a semiconductor substrate). In the illustrated embodiment, IPDs 120 are positioned on and mechanically coupled to portions of conductive material 108 exposed in recesses 118. In some contemplated embodiments, IPDs 120 may be electrically coupled to conductive material 108 (such as for routing connections to the IPDs). Discussion of the relative heights of IPDs 120 and conductive contacts 112 is found below in the description for the embodiment of substrate core 102 depicted FIG. 9.

In some embodiments, conductive contacts 116 are formed to conductive contacts 122 of IPDs 120. Conductive contacts 122 are contacts formed on the upper/lower surfaces of IPDs 120. Conductive contacts 122 may be, for example, copper contacts made to connections for passive devices on IPDs 120. Conductive contacts 116 may be formed through insulating layers 114 and connect to conductive contacts 122 to provide electrical connection areas for the passive devices on IPDs 120 above/below the insulating layers 114.

Turning now to build-up layers 104, in the illustrated embodiment, the build-up layers include insulating material 124 and conductive material 126. Insulating material 124 may include, for example, resin material, fiber material, glass material, other electrically insulating materials, or combinations thereof. Conductive material 126 may include, for example, copper or another electrically conductive material. In various embodiments, build-up layers 104 include multiple layers of insulating material 124 and multiple layers of conductive material 126 that are built-up (stacked) to form the build-up layers. The number of layers of insulating material 124 and conductive material 126 may vary based on, for example, desired mechanical or electrical properties of build-up layers 104 and package substrate 100. In various embodiments, build-up layers 104 enclose (e.g., encapsulate) IPD 120 in recess 118. In some embodiments, build-up layers 104 enclose insulating layer 114, which encloses IPD 120.

In various embodiments, layers of conductive material 126 are connected by vias 128. Vias 128 may be, for example, copper vias. Vias 128 may be formed through layers of insulating material 126 to provide electrical connections between the various layers of conductive material 126. Together, conductive material 126 and vias 128 provide electrical routing in build-up layers 104. Conductive material 126 and vias 128 may provide electrical routing through build-up layers 104 with insulating material providing electrical insulation between the different routings of conductive material 126 and vias 128. In certain embodiments, build-up layers 104 include conductive material 126 and vias 128 routed to IPDs 120, as illustrated in FIG. 1.

In the illustrated embodiment, frontside layer 130 is positioned over build-up layers 104. Frontside layer 130 may be, for example, a surface finish layer or other finishing layer. In certain embodiments, frontside layer 130 includes insulating layer 132 and conductive contacts 134 through the insulating layer. Insulating layer 132 may be, for example, a dielectric material such as ABF or solder resist. Conductive contacts 134 may be metal bumps or pads such as C4 bump pads or solder bumps. In some contemplated embodiments, conductive contacts 134 are plated contacts (e.g., contacts formed by ENIG (Electroless Nickel Immersion Gold) plating or ENEPIG (Electroless Nickel Electroless Palladium Immersion Gold) plating). In various embodiments, as illustrated in FIG. 1, conductive contacts 134 connect to conductive material 126 and vias 128 while extending above the upper surface of insulating layer 132 to provide electrical connections to the conductive material 126 and vias 128.

Turning back to substrate core 102, in certain embodiments, backside layer 136 is positioned on the lower surface of the substrate core. Backside layer 136 may include, for example, fiber, resist, or resin insulating materials such as ABF or solder resist. In various embodiments, backside layer 136 is a layer used as an adhesive layer between substrate core 102 and a carrier substrate that remains after the carrier substrate is removed, as described below. In the illustrated embodiment, backside layer 136 includes openings 138 to expose conductive contacts 116 through the backside layer. Accordingly, openings 138 allow electrical connections to be made to conductive contacts 116. Openings 138 may be formed through various methods, as described herein. The thickness of backside layer 136 may also vary based on the manufacturing method implemented or the design of package substrate 100, as described herein.

In the illustrated embodiment of FIG. 1, package substrate 100 is an asymmetric package substrate with multiple build-up layers 104 positioned above substrate core 102 and backside layer 136 positioned below the substrate core. While the illustrated embodiment of package substrate 100 depicts backside layer 136 as a single layer, it should be understood that package substrate 100 may include any number of backside layers depending on the routing or power requirements of the package substrate. The ability to vary the number of backside layers, however, is advantageous over symmetric package substrate designs that are required to have the same number of build-up layers on the frontside and the backside of substrate core 102 (due to requirements for the build-up process during substrate manufacturing). For instance, in the illustrated embodiment, the backside of substrate core 102 may have any number of backside layers 136 without affecting the structure or number of build-up layers 104 on the frontside of the substrate core. Accordingly, the structure of package substrate 100 may be flexible to accommodate different design, assembly, or yield considerations.

As described herein, substrate core 102 in package substrate 100, shown in FIG. 1, is a core with multiple layers (e.g., a 4-layer core). The presence of a multiple layer, thicker substrate core 102 in package substrate 100 may reduce warpage in the package substrate. Additionally, substrate core 102 may have a lower coefficient of thermal expansion than cores that have cavities or other openings through the core. The implementation of recesses 118 in substrate core 102 for coupling IPDs 120 to the substrate core may also allow the thickness of the substrate core to be determined regardless of the thickness of the IPDs, and vice versa. For instance, substrate core 102 may have any thickness compared to IPDs 120 as long as recesses 118 can be deep enough to allow the IPDs to be flush with the contacts on the surfaces of the substrate core (e.g., conductive contacts 112). The ability to have two IPDs 120 coupled to substrate core 102 may also increase the density of IPDs in package substrate 100. For instance, package substrate 100, shown in FIG. 1, may have double the IPD density for the same core area as other typical package substrates.

Example manufacturing processes for providing the asymmetric structure of package substrate 100 will now be discussed in more detail.

Example Fabrication Methods for Package Substrate 100

Figure 2:
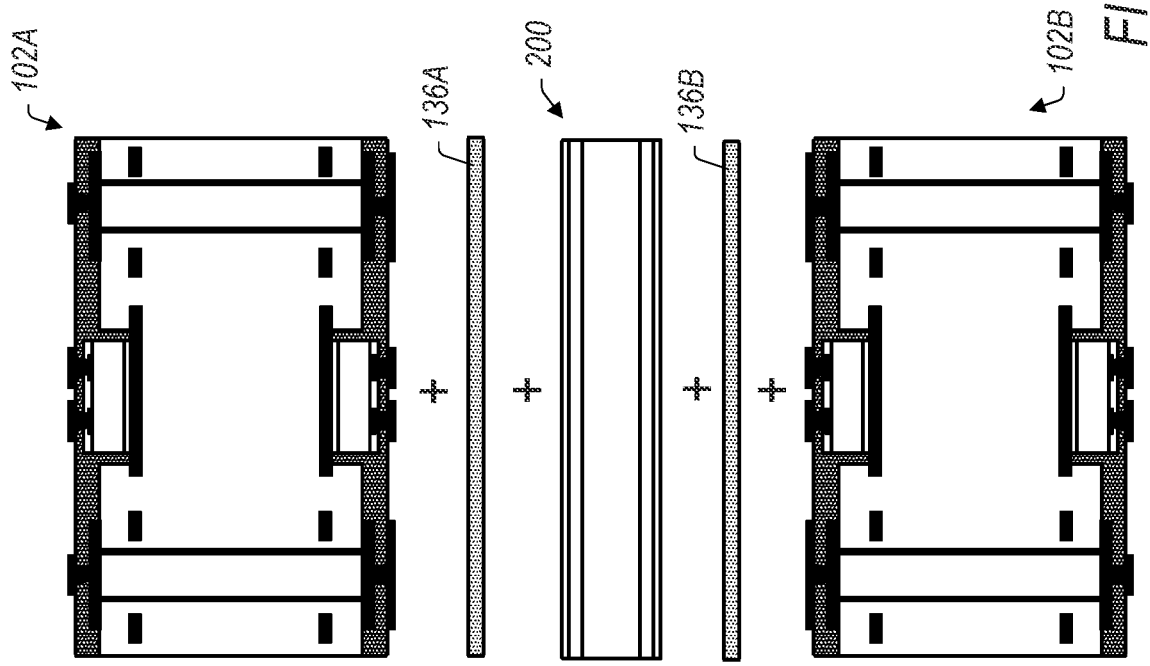
FIG. 2 depicts a side-view cross-sectional representation of an embodiment of substrate cores being coupled to a carrier substrate.

FIGS. 2-8 depict various steps in embodiments of a fabrication method for package substrate 100. FIG. 2 depicts a side-view cross-sectional representation of an embodiment of substrate cores being coupled to a carrier substrate. In FIG. 2, substrate cores 102A, 102B with IPDs 120 positioned in recesses 118 are coupled to carrier substrate 200. Carrier substrate 200 may be any substrate capable of mechanically supporting substrate cores 102A, 102B through various processing steps. In various embodiments, carrier substrate 200 is coupled to substrate cores 102A, 102B using backside layers 136A, 136B. Backside layers 136A, 136B may be, for example, fiber or resin layers such as ABF layers that can function as adhesive layers between substrate cores 102A, 102B and carrier substrate 200. In some embodiments, carrier substrate 200 and backside layers 136A, 136B are laminated to substrate cores 102A, 102B.

In certain embodiments, substrate core 102A and substrate core 102B are coupled to carrier substrate 200 with the substrate cores mirroring each other, as shown in FIG. 2. For instance, substrate core 102A is coupled in an upright (normal) orientation to the upper surface of carrier substrate 200 with backside layer 136A while substrate core 102B is coupled in an upside-down orientation to the lower surface of the carrier substrate with backside layer 136B.

Figure 3:
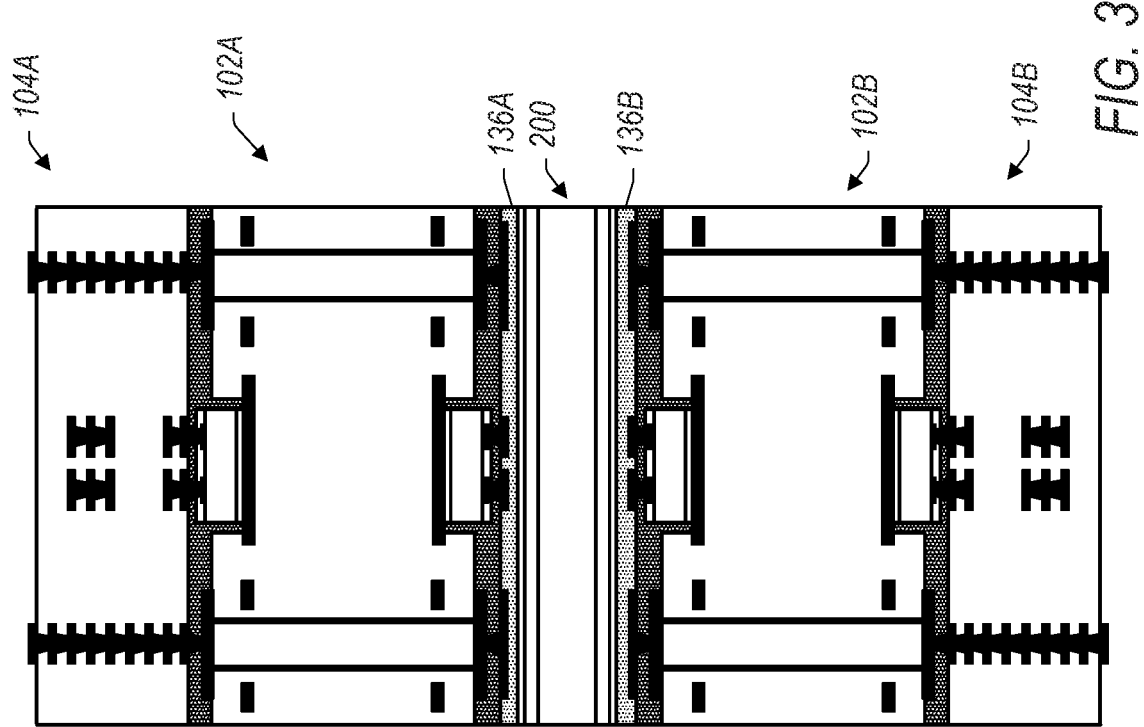
FIG. 3 depicts a side-view cross-sectional representation of an embodiment of build-up layers formed on substrate cores coupled to the carrier substrate.

FIG. 3 depicts a side-view cross-sectional representation of an embodiment of build-up layers formed on substrate cores coupled to the carrier substrate. In FIG. 3, build-up layer 104A is formed on substrate core 102A and build-up layer 104B is formed on substrate core 102B. In certain embodiments, build-up layers 104A, 104B are formed simultaneously on substrate cores 102A, 102B. For instance, as described above, typical build-up processes form build-up layers on both the frontside and backside of devices simultaneously. Thus, having the two substrate cores 102A, 102B coupled to carrier substrate 200 and mirroring each other allows the build-up process to form build-up layers 104A, 104B simultaneously on the two substrate cores. For instance, build-up layer 104A is formed on the "frontside" of carrier substrate 200 and build-up layer 104B is formed simultaneously on the "backside" of carrier substrate 200.

Figure 4:
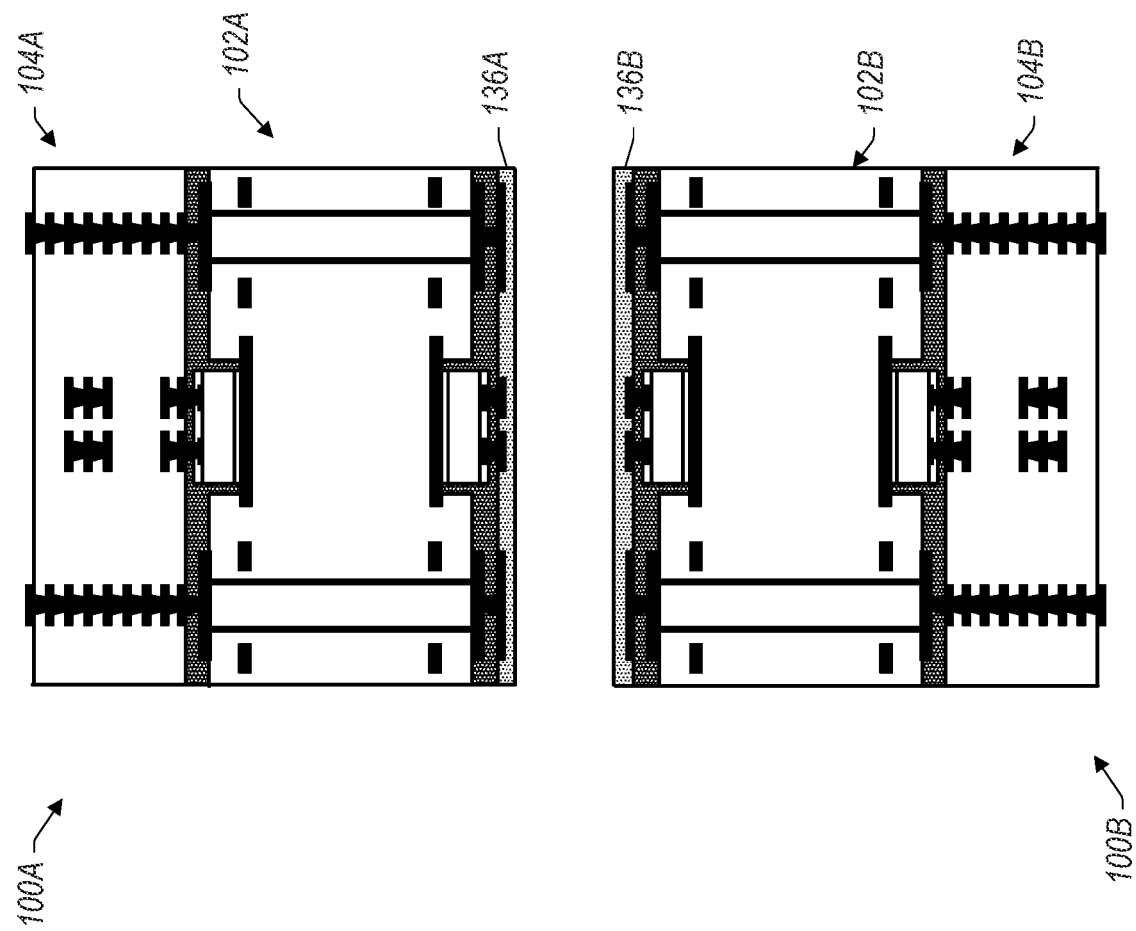
FIG. 4 depicts a side-view cross-sectional representation of an embodiment of a carrier substrate detached from substrate cores.

FIG. 4 depicts a side-view cross-sectional representation of an embodiment of carrier substrate 200 detached (e.g., removed) from substrate core 102A and substrate core 102B. After removing carrier substrate 200, backside layer 136A remains coupled to substrate core 102A and backside layer 136B remains coupled to the substrate core 102B. With carrier substrate 200 removed, two package substrates (e.g., first package substrate 100A and second package substrate 100B) are formed by the corresponding substrate cores and build-up layers, as shown in FIG. 4. Accordingly, a single build-up process step is able to form two package substrates—substrate core 102A with build-up layer 104A forming first package substrate 100A and substrate core 102B with build-up layer 104B forming second package substrate 100B. Forming two package substrates (e.g., first package substrate 100A and second package substrate 100B) using a similar build-up process to that used for forming a single package substrate with build-up layers on both the frontside and backside of the core may increase the throughput in producing the package substrates (e.g., two package substrates are formed instead of one package substrate).

FIGS. 5-8 depict examples of further processing steps on a package substrate after carrier substrate 200 is removed to form first package substrate 100A and second package substrate 100B. For simplicity in the drawings, these further processing steps are described with reference to package substrate 100. Accordingly, the additional processing described in reference to package substrate 100 may be implemented for either first package substrate 100A or second package substrate 100B, shown in FIG. 4.

Figure 5:
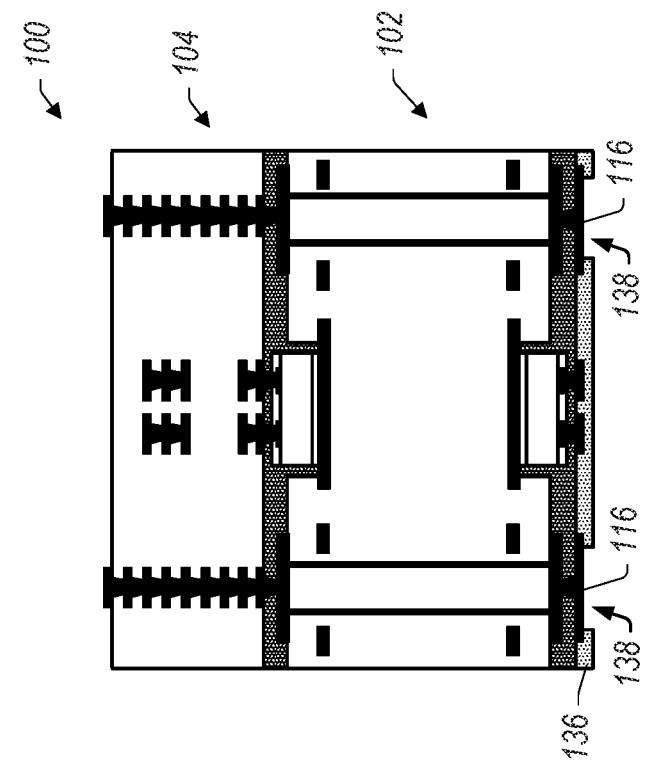
FIG. 5 depicts a side-view cross-sectional representation of an embodiment of openings formed to conductive contacts in a package substrate.

FIG. 5 depicts a side-view cross-sectional representation of an embodiment of openings formed to conductive contacts in a package substrate. In certain embodiments, openings 138 are formed to conductive contacts 116 through backside layer 136. In illustrated embodiment, openings 138 are formed by patterning and selective removal of material from backside layer 136 to form the openings (e.g., patterning using a resist and an etch process for selective removal).

Figure 6:
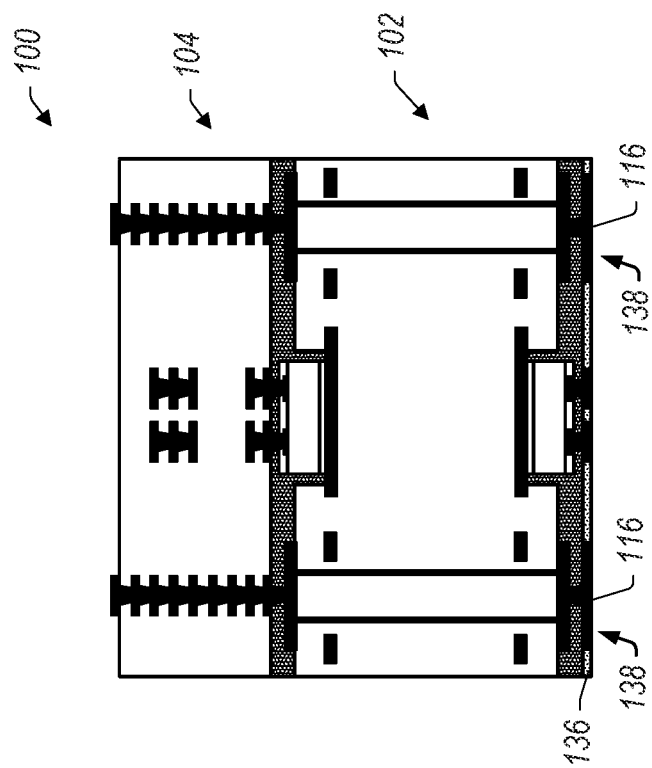
FIG. 6 depicts a side-view cross-sectional representation of an alternative embodiment of openings formed to conductive contacts in a package substrate.

FIG. 6 depicts a side-view cross-sectional representation of an alternative embodiment of openings formed to conductive contacts in a package substrate. In the illustrated embodiment, openings 138 are formed by thinning backside layer 136 down to a height of conductive contacts 116. Thinning backside layer 136 may include, for example, planarization of the backside layer or other known techniques.

In various embodiments, surface finishes may be formed after openings 138 to conductive contacts 116 are formed. Surface finishes may include, but not be limited to, adding additional conductive contacts or adding insulating layers on package substrate 100. FIG. 7 depicts a side-view cross-sectional representation of an embodiment of surface finishes on a package substrate. In certain embodiments, the surface finishes in FIG. 7 are implemented on the embodiment of package substrate 100 shown in FIG. 5. Additional embodiments, however, may be contemplated where the surface finishes in FIG. 7 are implemented on other embodiments of a package substrate (such as package substrate 100 shown in FIG. 6).

The embodiment of package substrate 100 depicted in FIG. 7 may be similar in structure to the embodiment of package substrate 100 depicted in FIG. 1. In the illustrated embodiment of FIG. 7, frontside layer 130, which includes insulating layer 132 and conductive contacts 134 through the insulating layer, is formed on the upper surface (in the illustration) of build-up layers 104. In certain embodiments, insulating layer 132 is a solder resist layer and conductive contacts 134 include a combination of conductive materials. For instance, conductive contacts 134 may include a combination of plated contacts (e.g., contacts formed by ENIG or ENEPIG) formed on build-up layers 104 and ball contacts (e.g., solder ball contacts) formed on top of the plated contacts.

FIG. 8 depicts a side-view cross-sectional representation of an alternative embodiment of surface finishes on a package substrate. In certain embodiments, the surface finishes in FIG. 8 are implemented on the embodiment of package substrate 100 shown in FIG. 6. Additional embodiments, however, may be contemplated where the surface finishes in FIG. 8 are implemented on other embodiments of a package substrate (such as package substrate 100 shown in FIG. 5). As shown in FIG. 8, insulating layer 132 and conductive contacts 134 are formed on the frontside of build-up layers 104, thus forming frontside layer 130.

In the illustrated embodiment, conductive contacts 134 in frontside layer 130 are plated contacts in insulating layer 132 and the insulating layer is thinned (e.g., planarized) to expose the conductive contacts. Additionally, the backside of package substrate 100 (e.g., the lower surface of substrate core 102) includes conductive contacts 116 exposed through backside layer 136 by openings 138. As backside layer 136, shown in FIG. 8, is relatively thin and at the same height as conductive contacts 116, in some embodiments, an additional backside layer (e.g., backside layer 800) is formed over backside layer 136 with openings 138 extending through the additional backside layer.

As described herein, the process step examples depicted in FIGS. 2-8 provide various embodiments for producing two package substrates using a single carrier substrate. Producing two package substrates from a single carrier substrate increases the output quantity of package substrates from the single carrier substrate. It should be understood that additional package substrates may be formed from a single carrier substrate during some processing techniques. For instance, a single carrier substrate may be capable of supporting multiple substrate cores on a single side of the carrier substrate (such as in side-by-side positioning). Accordingly, the process step examples depicted in FIGS. 2-8 may double the output quantity of package substrates from any carrier substrate, thereby increasing the throughput for producing package substrates.

Example Fabrication Method for Substrate Core 102 with IPD 120

Figure 9:
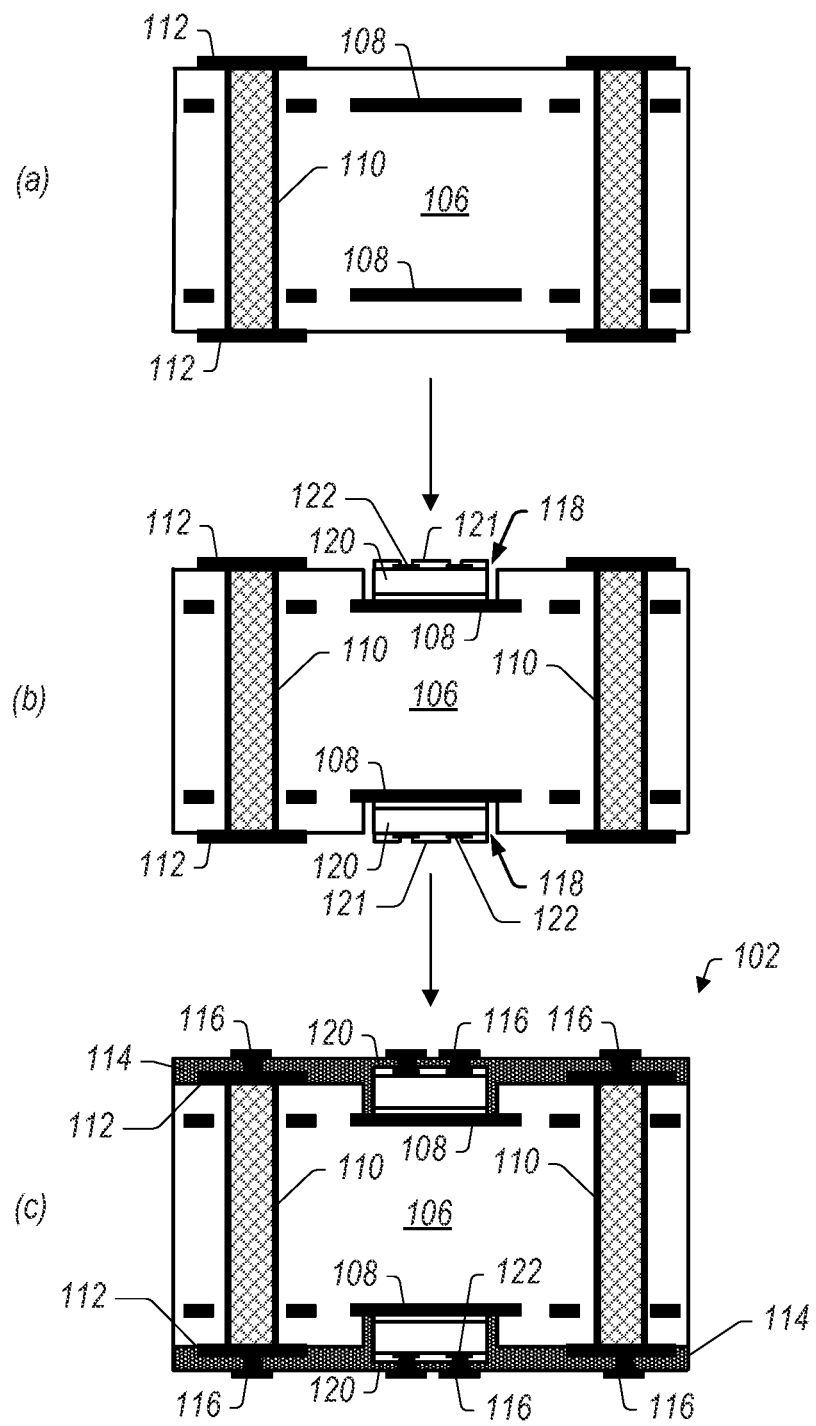
FIG. 9 depicts a side-view cross-sectional representation of various steps in an embodiment of a fabrication method for a substrate core.

FIG. 9 depicts a side-view cross-sectional representation of various steps in an embodiment of a fabrication method for substrate core 102. In step (a), insulating material 106 is provided with layers of conductive material 108 along with vias 110 formed between conductive contacts 112. In the illustrated embodiment, insulating material 106 is a four-layer insulating material. The thickness of insulating material 106 may, however, vary depending on desired properties of substrate core 102.

In step (b), recesses 118 are formed in the upper and lower surfaces of insulating material 106. In certain embodiments, recesses 118 are formed to a depth of the upper and lower layers of conductive material 108. Recesses 118 may be formed by, for example, laser cavity etching of insulating material 106. In various embodiments, the depth of recesses 118 and conductive material 108 may be predetermined by a height (thickness) of IPDs 120 that are to be positioned in the recesses. In certain embodiments, recesses 118 and conductive material 108 have a depth such that when IPDs 120 are positioned in the recesses, upper/lower surfaces 121 of the IPDs have heights that are similar as heights of conductive contacts 112. For instance, the distances of upper/lower surfaces 121 of IPDs 120 from the upper/lower surfaces of insulating material 106 is substantially the same as the distances of the upper/lower surfaces of conductive contacts 112 from the upper/lower surfaces of insulating material 106. Accordingly, upper/lower surfaces 121 of IPDs 120 may be considered to be substantially flush with the upper/lower surfaces of conductive contacts 112. While upper/lower surfaces 121 are at similar heights to the upper/lower surfaces of conductive contacts 112, there may be some small variations in the heights, as shown in FIGS. 1 and 9. Such surfaces may still be considered to be flush in terms of the design of package substrate 100. These small differences in height may be caused, for example, by manufacturing variations.

After IPDs 120 are positioned in recesses 118, insulating layers 114 and conductive contacts 116 through the insulating layers may be formed, as shown in step (c). Forming insulating layers 114 may include, for example, lamination or other insulating material deposition techniques. Either laser etching or resist patterning and etching may be used to form openings through insulating layers 114 to conductive contacts 112 and/or conductive contacts 122. The openings may then be filled with conductive material (e.g., metal) to form conductive contacts 116. Substrate core 102, shown in step (c) of FIG. 9, may be the result of formation of insulating layers 114 and conductive contacts 116. Substrate core 102 may then be further processed as described herein (e.g., coupling to carrier substrate 200 and formation of build-up layers 104, as shown in FIGS. 2-8).

Exemplary Embodiments with Coreless Substrate in Package Substrate

Figure 10:
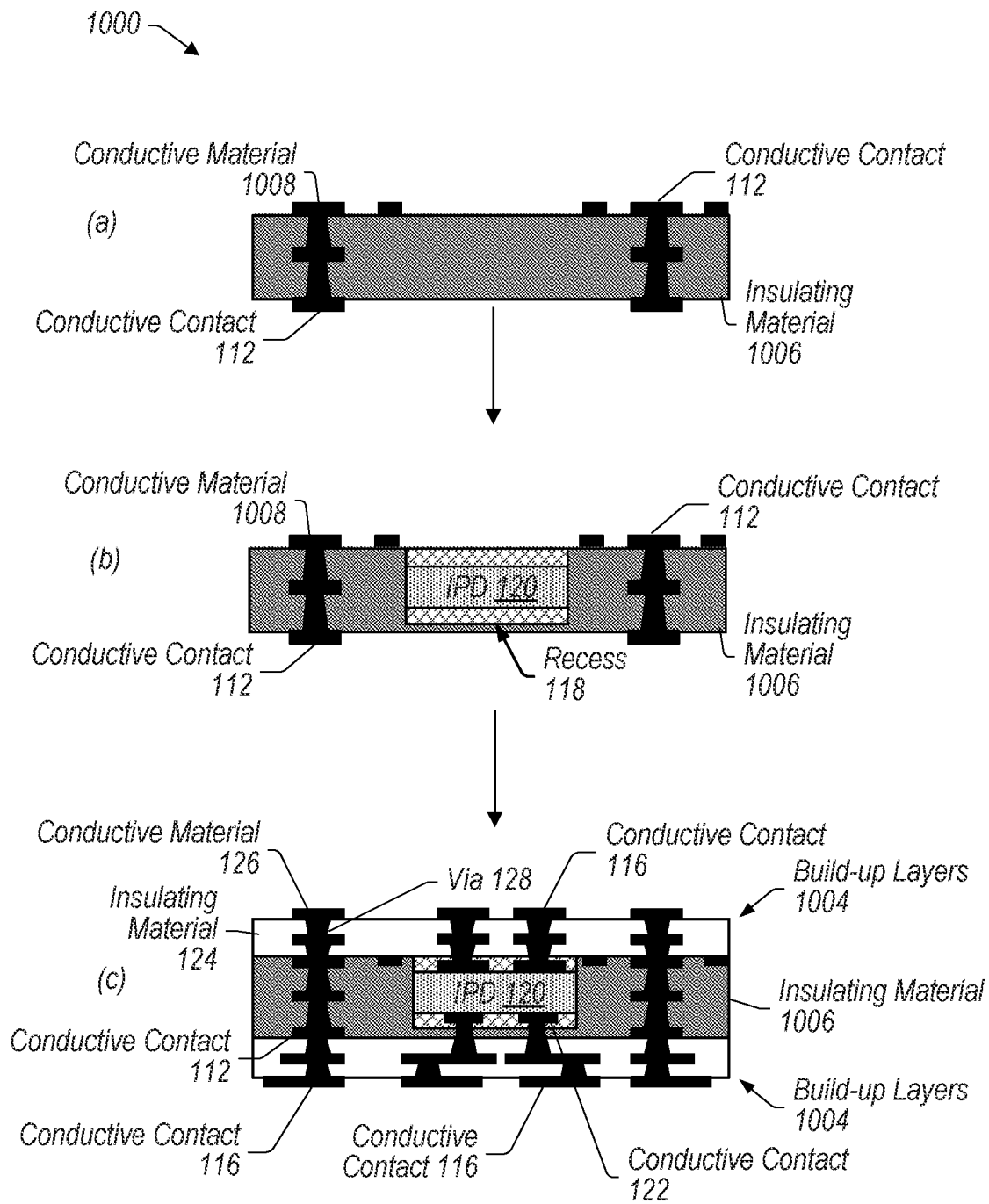
FIG. 10 depicts a side-view cross-sectional representation of various steps in an embodiment of a fabrication method for a coreless substrate.

In various embodiments, package substrate 100 may include a coreless substrate rather than a substrate core (e.g., substrate core 102 is replaced with a coreless substrate). FIG. 10 depicts a side-view cross-sectional representation of various steps in an embodiment of a fabrication method for coreless substrate 1000. In step (a), the formation of coreless substrate 1000 begins with insulating material 1006. Insulating material 1006 may include insulating materials such as, but not limited to, resin material, fiber material, glass material, other electrically insulating materials, or combinations thereof. Conductive material 1008 is then positioned (e.g., formed) in insulating material 1006. Conductive materials 1008 may include, but not be limited to, copper material or copper alloy material. In various embodiments, conductive materials 1008 on the upper/lower surfaces of insulating material 1006 may form conductive contacts 112.

With insulating material 1006 and core material 1008 in place, in step (b), recess 118 is formed in the upper surface of insulating material 1006. Recess 118 may be formed by, for example, laser cavity etching of insulating material 1006. After recess 118 is formed, IPD 120 may be positioned in the recess. It should be noted that due to the relatively small thickness of coreless substrate 1000 (e.g., insulating material 1006), that typically only one recess 118 and one IPD 120 may be placed in the coreless substrate. Embodiments of thicker coreless substrates with two recesses and two IPDs may, however, be contemplated.

After IPD 120 is positioned in recess 118, in step (c), coreless substrate build-up layers 1004 may be formed on the upper and lower surfaces of insulating material 1006. Build-up layers 1004 may be formed similarly to build-up layers 104, as described herein. For instance, build-up layers 1004 may include insulating material 124 with conductive material 126 and vias 128 positioned in the insulating material. Additionally, conductive contacts 122 may be coupled to IPD 120. Conductive contacts 122 and/or conductive contacts 112 may be connected to conductive contacts 116 on build-up layers 1004 (e.g., using conductive material 126 and vias 128). In various embodiments, build-up layers 1004 include multiple layers of insulating material 124 and multiple layers of conductive material 126 that are built-up (stacked) to form the build-up layers. In one contemplated embodiment, build-up layers 1004 include two layers of insulating material and conductive material 126. Other numbers of layers, however, may be contemplated for coreless substrate 1000. In various embodiments, build-up layers 1004 enclose (e.g., encapsulate) IPD 120 in recess 118.

Coreless substrate 1000, shown in FIG. 10, may then be further processed to form a package substrate. For instance, coreless substrate 1000 may be processed similarly to the process for forming a package substrate from substrate core 102, as shown in FIGS. 2-8. In various embodiments, two coreless substrates 1000 are processed using a carrier substrate (e.g., carrier substrate 200) with the formation of build-up layers 104 on both coreless substrates simultaneously, as shown in FIGS. 2 and 3.

Figure 11:
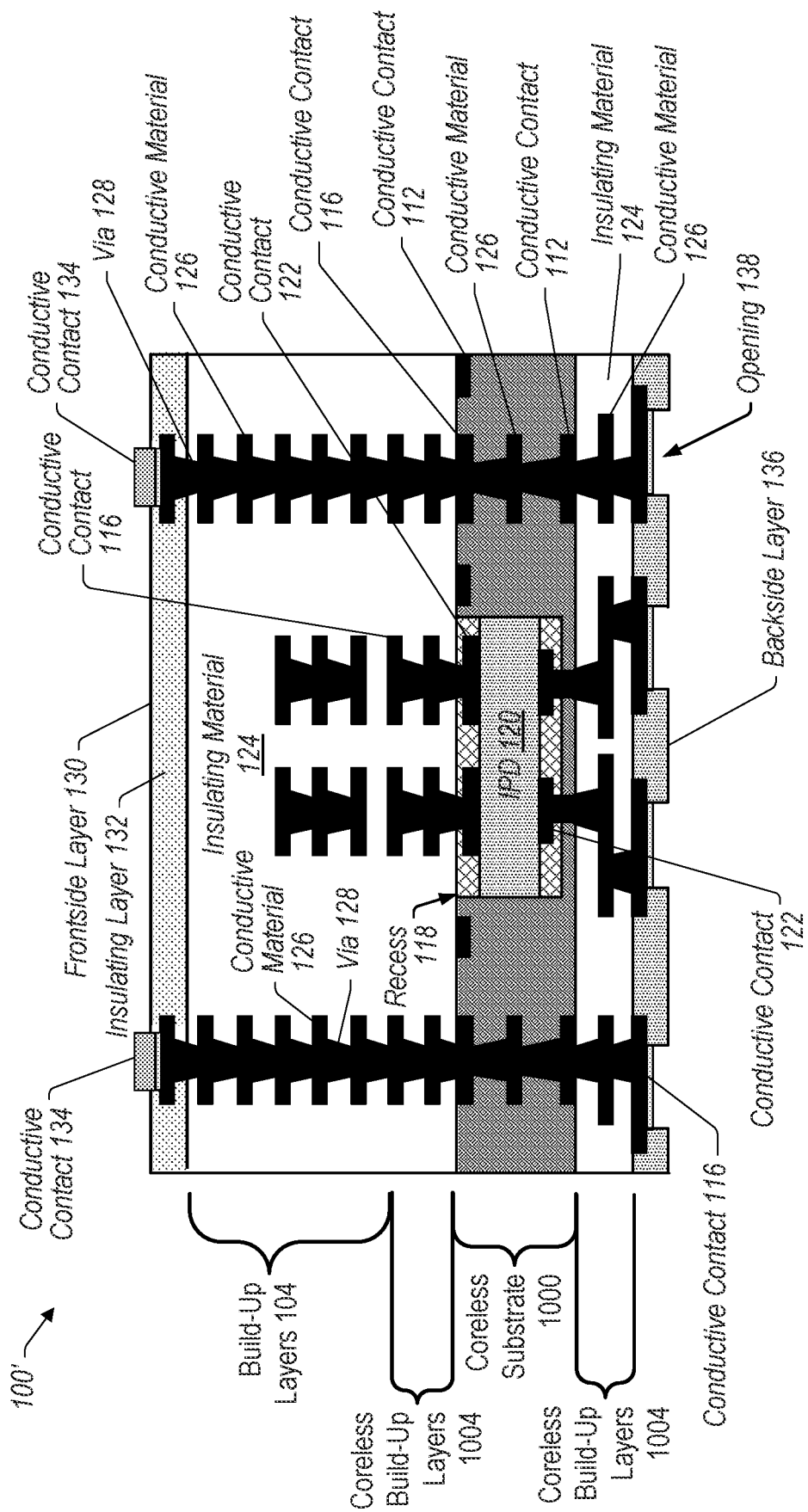
FIG. 11 depicts a side-view cross-sectional representation of an embodiment of a package substrate with a coreless substrate.

FIG. 11 depicts a side-view cross-sectional representation of an embodiment of package substrate 100' with coreless substrate 1000. In the illustrated embodiment, build-up layers 104 are formed on the upper surface of coreless substrate 1000. For instance, build-up layers 104 are formed on the upper surface of coreless build-up layers 1004. Build-up layers 104 in package substrate 100' may be formed similarly to the build-up layers in package substrate 100, shown in FIG. 1. For instance, build-up layers 104 may include insulating material 124 and conductive material 126. Insulating material 124 in build-up layers 104 may be the same insulating material as used in coreless build-up layers 1004. In various embodiments, build-up layers 104 include multiple layers of insulating material 124 and multiple layers of conductive material 126 that are built-up (stacked) to form the build-up layers. As described above, the number of layers of insulating material 124 and conductive material 126 may vary based on, for example, desired mechanical or electrical properties of build-up layers 104 and package substrate 100'.

In various embodiments, as described herein, layers of conductive material 126 may be connected by vias 128 (e.g., copper vias). In the illustrated embodiment, frontside layer 130 is positioned over build-up layers 104. Frontside layer 130 may be, for example, a surface finish layer or other finishing layer. In certain embodiments, frontside layer 130 includes insulating layer 132 and conductive contacts 134 through the insulating layer.

In various embodiments, backside layer 136 is positioned on the lower surface of the coreless substrate 1000 (e.g., on the lower surface of coreless build-up layers 1004). Backside layer 136 may be a layer used as an adhesive layer between coreless substrate 1000 and a carrier substrate that remains after the carrier substrate is removed, as described herein. In the illustrated embodiment, backside layer 136 includes openings 138 to expose conductive contacts 116 through the backside layer.

In the illustrated embodiment of FIG. 11, package substrate 100' is an asymmetric package substrate with multiple build-up layers 104 positioned above coreless substrate 1000 and backside layer 136 positioned below the coreless substrate with intervening coreless build-up layers 1004. Package substrate 100' may include any number of backside layers 136 and intervening coreless build-up layers 1004 depending on the routing or power requirements of the package substrate. The ability to vary the number of backside layers and intervening coreless build-up layers 1004, however, is advantageous over symmetric package substrate designs that are required to have the same number of build-up layers on the frontside and the backside of a substrate (due to requirements for the build-up process during substrate manufacturing). For instance, in the illustrated embodiment, the backside of coreless substrate 1000 may have any number of backside layers 136 and intervening coreless build-up layers 1004 without affecting the structure or number of build-up layers 104 on the frontside of the substrate core. Accordingly, the structure of package substrate 100' may be flexible to accommodate different design, assembly, or yield considerations.

Example Fabrication Method

FIG. 12 is a flow diagram illustrating a method 1200 of fabrication for package substrate 100, according to some embodiments. At 1202, in the illustrated embodiment, a first recess is formed in an upper surface of a substrate core having multiple insulating layers built-up in a vertical dimension with at least one conductive material layer positioned in the insulating layers.

At 1204, in the illustrated embodiment, a second recess is formed in a lower surface of the substrate core in the vertical dimension.

At 1206, in the illustrated embodiment, a first integrated passive device is positioned in the first recess. In some embodiments, the first integrated passive device is coupled to the at least one conductive material layer exposed in the first recess.

At 1208, in the illustrated embodiment, a second integrated passive device is positioned in the second recess.

At 1210, in the illustrated embodiment, a plurality of build-up layers is formed on the upper surface of the substrate core. In some embodiments, at least one insulating layer is formed on the lower surface of the substrate core. The at least one insulating layer may be patterned to expose the second conductive contact through the single insulating layer.

At 1212, in the illustrated embodiment, at least one via path is formed through the build-up layers and the substrate core where the at least one via path connects a second conductive contact positioned on the lower surface of the substrate core to an upper surface of the build-up layers. In some embodiments, forming the at least one via path includes forming a via through the build-up layers that connects to a via through the substrate core.

Example Computer System

Figure 13:
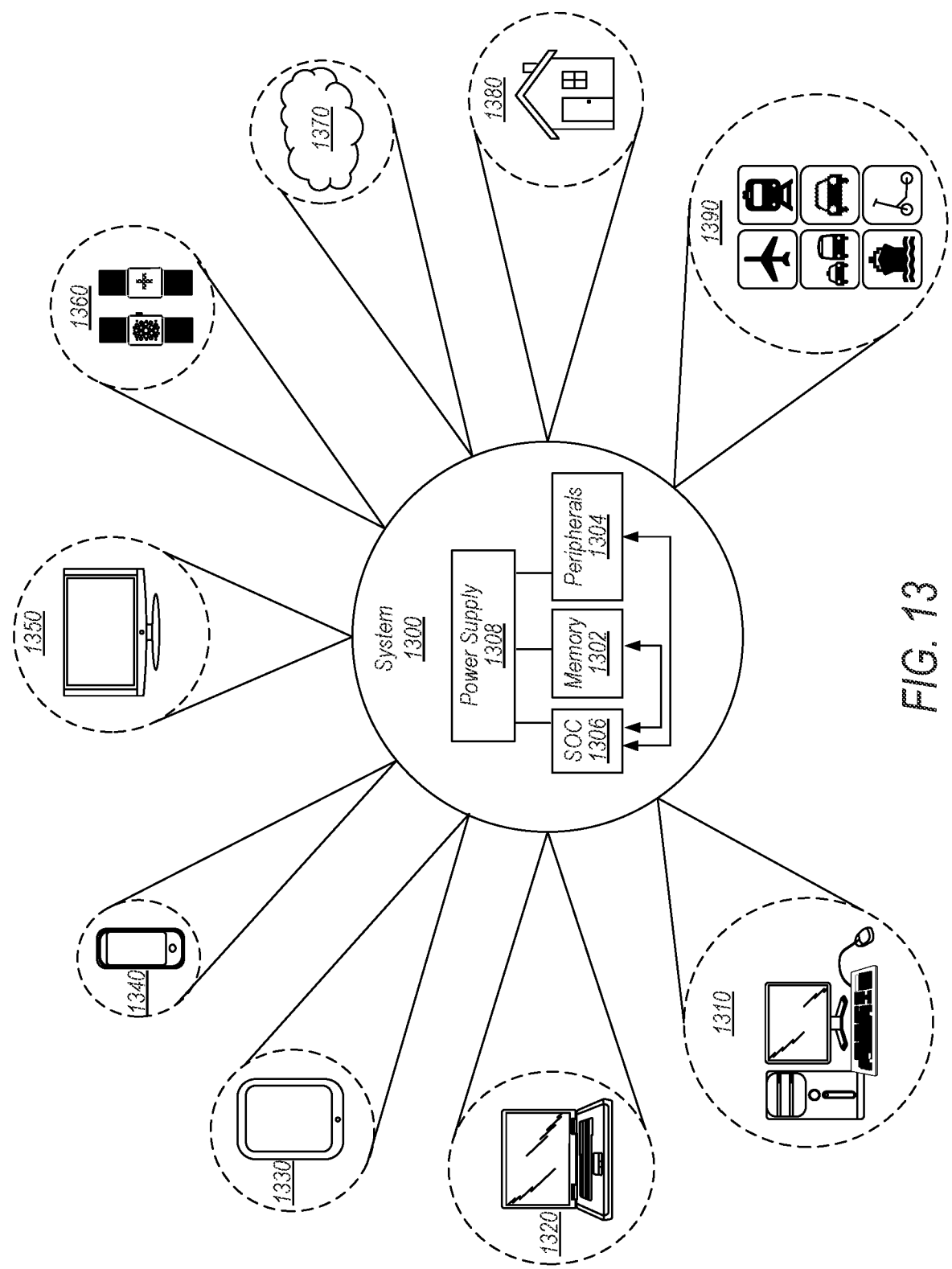
FIG. 13 is a block diagram of one embodiment of an example system.

Turning next to FIG. 13, a block diagram of one embodiment of a system 1300 is shown that may incorporate and/or otherwise utilize the methods and mechanisms described herein. In the illustrated embodiment, the system 1300 includes at least one instance of a system on chip (SoC) 1306 which may include multiple types of processing units, such as a central processing unit (CPU), a graphics processing unit (GPU), or otherwise, a communication fabric, and interfaces to memories and input/output devices. In some embodiments, one or more processors in SoC 1306 includes multiple execution lanes and an instruction issue queue similar to processor NNN (of FIG. N) and processor NNN (of FIG. N). In various embodiments, SoC 1306 is coupled to external memory 1302, peripherals 1304, and power supply 1308.

A power supply 1308 is also provided which supplies the supply voltages to SoC 1306 as well as one or more supply voltages to the memory 1302 and/or the peripherals 1304. In various embodiments, power supply 1308 represents a battery (e.g., a rechargeable battery in a smart phone, laptop or tablet computer, or other device). In some embodiments, more than one instance of SoC 1306 is included (and more than one external memory 1302 is included as well).

The memory 1302 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1304 include any desired circuitry, depending on the type of system 1300. For example, in one embodiment, peripherals 1304 includes devices for various types of wireless communication, such as Wi-Fi, Bluetooth, cellular, global positioning system, etc. In some embodiments, the peripherals 1304 also include additional storage, including RAM storage, solid state storage, or disk storage. The peripherals 1304 include user interface devices such as a display screen, including touch display screens or multi-touch display screens, keyboard or other input devices, microphones, speakers, etc.

As illustrated, system 1300 is shown to have application in a wide range of areas. For example, system 1300 may be utilized as part of the chips, circuitry, components, etc., of a desktop computer 1310, laptop computer 1320, tablet computer 1330, cellular or mobile phone 1340, or television 1350 (or set-top box coupled to a television). Also illustrated is a smartwatch and health monitoring device 1360. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1300 may further be used as part of a cloud-based service(s) 1370. For example, the previously mentioned devices, and/or other devices, may access computing resources in the cloud (i.e., remotely located hardware and/or software resources). Still further, system 1300 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 13 is the application of system 1300 to various modes of transportation. For example, system 1300 may be used in the control and/or entertainment systems of aircraft, trains, buses, cars for hire, private automobiles, waterborne vessels from private boats to cruise liners, scooters (for rent or owned), and so on. In various cases, system 1300 may be used to provide automated guidance (e.g., self-driving vehicles), general systems control, and otherwise. These any many other embodiments are possible and are contemplated. It is noted that the devices and applications illustrated in FIG. 13 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit package apparatus, comprising:
a substrate including at least one layer of insulating material layer;
an integrated passive device positioned on a first portion of an upper surface of the substrate in a vertical dimension;
a first conductive contact positioned on a second portion of the upper surface of the substrate, the second portion being on a perimeter of the upper surface around the first portion;
a plurality of insulating build-up layers positioned on the upper surface of the substrate and on upper surfaces of the integrated passive device and the first conductive contact;
a second conductive contact positioned on an upper surface of the insulating build-up layers in the vertical dimension; and
a via path through the insulating build-up layers, wherein the via path connects the second conductive contact to the first conductive contact.

2. The apparatus of claim 1, further comprising:
a third conductive contact positioned on a lower surface of the substrate in the vertical dimension; and
a second via path through the substrate connecting the first conductive contact to the third conductive contact.

3. The apparatus of claim 1, wherein the plurality of insulating build-up layers encloses the first integrated passive device and the first conductive contact.

4. The apparatus of claim 1, wherein the integrated passive device includes a plurality of passive devices coupled to a passive device substrate.

5. The apparatus of claim 1, further comprising one or more fourth conductive contacts positioned on an upper surface of the integrated passive device.

6. The apparatus of claim 5, further comprising one or more fifth conductive contacts positioned in the plurality of insulating build-up layers, wherein the fifth conductive contacts are coupled to the fourth conductive contacts.

7. The apparatus of claim 1, further comprising one or more sixth conductive contacts positioned on a lower surface of the integrated passive device.

8. The apparatus of claim 1, further comprising a backside layer of conductive contacts positioned vertically below the substrate.

9. The apparatus of claim 8, further comprising conductive material connecting one or more of the conductive contacts in the backside layer to the integrated passive device.

10. The apparatus of claim 8, further comprising conductive material connecting one or more of the conductive contacts in the backside layer to the substrate.

11. The apparatus of claim 1, wherein the first portion of the upper surface of the substrate is a recessed portion, and wherein the integrated passive device is positioned at least partially in the recessed portion.

12. An integrated circuit package apparatus, comprising:
a substrate including at least one layer of insulating material layer;
an integrated passive device positioned on a portion of an upper surface of the substrate in a vertical dimension;

one or more first conductive contacts coupled to an upper surface of the integrated passive device;
one or more second conductive contacts coupled to a lower surface of the integrated passive device;
a plurality of insulating build-up layers positioned on the upper surface of the substrate, wherein the insulating build-up layers enclose the first conductive contacts and the integrated passive device;
one or more third conductive contacts positioned in the insulating build-up layers, wherein the third conductive contacts are electrically coupled to the first conductive contacts; and
a layer of backside conductive contacts positioned vertically below the substrate, wherein at least some of the second conductive contacts are electrically coupled to one or more of the backside conductive contacts.

13. The apparatus of claim 12, further comprising conductive material electrically coupling the backside conductive contacts to the second conductive contacts.

14. The apparatus of claim 12, wherein the backside conductive contacts are positioned in openings of a backside insulating layer.

15. The apparatus of claim 12, further comprising:
a fourth conductive contact positioned on another portion of the upper surface of the substrate on a perimeter of the integrated passive device;
a fifth conductive contact positioned on an upper surface of the insulating build-up layers in the vertical dimension; and
a via path through the insulating build-up layers, wherein the via path connects the second conductive contact to the first conductive contact.

16. The apparatus of claim 15, further comprising:
a sixth conductive contact positioned on a lower surface of the substrate in the vertical dimension; and
a second via path through the substrate connecting the fourth conductive contact to the sixth conductive contact.

17. An integrated circuit package apparatus, comprising:
a substrate including at least one layer of insulating material layer;
an integrated passive device positioned on a first portion of an upper surface of the substrate in a vertical dimension;
a plurality of first conductive contacts positioned on a second portion of the upper surface of the substrate, the second portion being on a perimeter of the upper surface around the first portion in a horizontal dimension, wherein the first conductive contacts are on a perimeter of the integrated passive device in the horizontal dimension;
a plurality of insulating build-up layers positioned on the upper surface of the substrate and on upper surfaces of the integrated passive device and the first conductive contact;
a plurality of second conductive contacts positioned on an upper surface of the insulating build-up layers in the vertical dimension; and
a plurality of via paths through the insulating build-up layers, wherein the via paths connect the second conductive contacts to the first conductive contacts.

18. The apparatus of claim 17, further comprising:
a plurality of third conductive contacts positioned on a lower surface of the substrate in the vertical dimension; and
a plurality of second via paths through the substrate connecting the first conductive contacts to the third conductive contacts.

19. The apparatus of claim 17, further comprising a second plurality of build-up layers positioned on a lower surface of the substrate in the vertical dimension.

20. The apparatus of claim 17, further comprising a plurality of fourth conductive contacts positioned in the plurality of insulating build-up layers, the fourth conductive contacts being coupled to the integrated passive device.

* * * * *